US009391634B1

(12) United States Patent
Rangachari

(10) Patent No.: US 9,391,634 B1
(45) Date of Patent: Jul. 12, 2016

(54) SYSTEMS AND METHODS OF LOW POWER DECIMATION FILTER FOR SIGMA DELTA ADC

(71) Applicant: Texas Instruments Incorporated, Dallas, TX (US)

(72) Inventor: Sundarrajan Rangachari, Trichy, IN (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/754,022

(22) Filed: Jun. 29, 2015

(51) Int. Cl.
*H03M 3/00* (2006.01)
*H03H 17/06* (2006.01)
*H03M 1/12* (2006.01)

(52) U.S. Cl.
CPC ............... *H03M 3/462* (2013.01); *H03M 3/32* (2013.01); *H03M 3/344* (2013.01); *H03M 3/466* (2013.01); *H03M 3/478* (2013.01); *H03M 3/496* (2013.01); *H03H 17/06* (2013.01); *H03H 17/0664* (2013.01); *H03H 17/0685* (2013.01); *H03M 1/12* (2013.01); *H03M 3/30* (2013.01)

(58) Field of Classification Search
CPC .......... H03H 17/0685; H03H 17/0664; H03H 17/06; H03M 3/30; H03M 1/12
USPC ............. 341/143, 155, 61; 708/313, 552, 319
See application file for complete search history.

(56) References Cited

U.S. PATENT DOCUMENTS 6,725,248 B1 * 4/2004 Hasegawa .......... H03H 17/0219
708/313

* cited by examiner

*Primary Examiner* — Joseph Lauture
(74) *Attorney, Agent, or Firm* — Lawrence J. Bassuk; Frank D. Cimino

(57) ABSTRACT

Example embodiments of the systems and methods of low power decimation filter exploit the single bit data input to the filter and the symmetry of the filter response. The input data may be treated as 0 and 1 instead of −1 and +1. The symmetry of the sinc filter may be exploited since the data across different polyphases are combined. The addition of the symmetric data and coefficient multiplication may be replaced with simple muxing based on two bits and the use of unsigned logic for all adders following coefficient multiplication as both data and coefficient are non-negative.

20 Claims, 4 Drawing Sheets

SYSTEMS AND METHODS OF LOW POWER DECIMATION FILTER FOR SIGMA DELTA ADC

TECHNICAL FIELD

The present disclosure is generally related to electronics and, more particularly, is related to digital filters.

BACKGROUND

Analog techniques have dominated signal processing for years, but digital techniques are slowly encroaching into this domain. The design of sigma-delta (ΣΔ) analog-to-digital converters (ADCs) is approximately three-quarters digital and one-quarter analog. ΣΔ ADCs are now ideal for converting analog signals over a wide range of frequencies, from DC to several megahertz. Basically, these converters comprise an oversampling modulator followed by a decimation filter that together produce a high-resolution data-stream output.

The rudimentary ΣΔ converter is a 1-bit sampling system. An analog signal applied to the input of the converter is sampled multiple times, a technique known as oversampling. The sampling rate may be hundreds of times faster than the digital results at the output ports. Each individual sample may be accumulated over time and "averaged" with the other input-signal samples through the decimation filter. The decimation filter typically consumes high power since they operate at very high operating frequency typically few hundreds of MHz to a few GHz. There are heretofore unaddressed needs with previous decimation filter solutions.

SUMMARY

Example embodiments of the present disclosure provide systems of low power decimation filter. Briefly described, in architecture, one example embodiment of the system, among others, can be implemented as follows: a plurality of D flip flops, each of the plurality of D flip flops configured to receive one bit of an N-bit sequence; a plurality of shift registers configured to store the input sequence; a data combiner configured to combine the outputs of the plurality of shift registers; one or more multiplexers configured to implement coefficient multiplication; and a summer to sum the outputs.

Embodiments of the present disclosure can also be viewed as providing methods for low power decimation filter. In this regard, one embodiment of such a method, among others, can be broadly summarized by the following steps: receiving a digital input stream, the digital input stream comprising a sequence of symbols indicating values of −1 and +1; converting the sequence such that −1 is converted to zero; storing the sequence in shift registers; applying filter coefficients to the polyphase shift register outputs; and adding the coefficient application results to form a final output.

DETAILED DESCRIPTION

Embodiments of the present disclosure will be described more fully hereinafter with reference to the accompanying drawings in which like numerals represent like elements throughout the several figures, and in which example embodiments are shown. Embodiments of the claims may, however, be embodied in many different forms and should not be construed as limited to the embodiments set forth herein. The examples set forth herein are non-limiting examples and are merely examples among other possible examples.

Figure 1:
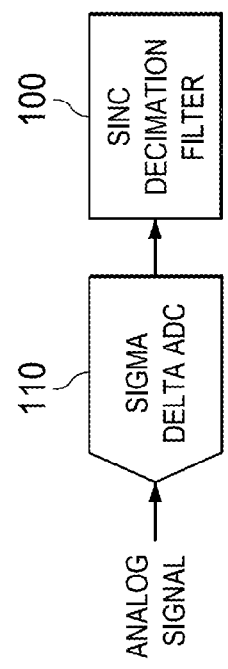
FIG. 1 is a block diagram of an example embodiment of a ΣΔ converter.

As shown in FIG. 1, a ΣΔ converter's primary internal cells are ΣΔ modulator 110 and decimation filter 100. ΣΔ modulator 110 coarsely samples the input signal at a very high rate into a 1-bit stream. Decimation filter 100 then takes this sampled data and converts it into a high-resolution, slower digital code. While most converters have one sample rate, the ΣΔ converter has two—the input sampling rate ($f_S$) and the output data rate ($f_D$).

ΣΔ modulator 110 is the heart of the ΣΔ ADC. It is responsible for digitizing the analog input signal and reducing noise at lower frequencies. In this stage, the architecture implements a function called noise shaping that pushes low-frequency noise up to higher frequencies where it is outside the band of interest. Noise shaping is one of the reasons that ΣΔ converters are well-suited for low-frequency, high-accuracy measurements.

The input signal to ΣΔ modulator 110 may be a time-varying analog voltage. There are two ways to look at ΣΔ modulator 110—in the time domain or in the frequency domain. In the time-domain, ΣΔ modulator 110 converts the analog input signal to a high-speed, single-bit, modulated pulse wave. ΣΔ modulator 110 acquires many samples of the input signal to produce a stream of 1-bit codes. The system clock implements the sampling speed, $f_S$, in conjunction with the modulator's 1-bit comparator. In this manner, the quantizing action of ΣΔ modulator 110 is produced at a high sample rate that is equal to that of the system clock. Like all quantizers, ΣΔ modulator 110 produces a stream of digital values that represent the voltage of the input, in this case a 1-bit stream. As a result, the ratio of the number of ones to zeros represents the input analog voltage. Unlike most quantizers, ΣΔ modulator 110 includes an integrator, which has the effect of shaping the quantization noise to higher frequencies. Consequently, the noise spectrum at the output of the modulator is not flat.

In the time domain, the analog input voltage and the output of the 1-bit digital-to-analog converter (DAC) are differentiated, providing an analog voltage. This voltage is presented to the integrator, whose output progresses in a negative or positive direction. The slope and direction of this signal is dependent on the sign and magnitude of the voltage at the input to the integrator. At the time the voltage at the output of the integrator equals the comparator reference voltage, the output of the comparator switches from negative to positive, or positive to negative, depending on its original state. The output value of the comparator is clocked back into a 1-bit DAC, as well as clocked out to the digital filter stage. At the time that the output of the comparator switches from high to low or vice versa, the 1-bit DAC responds by changing the analog output voltage of a difference amplifier. This creates a different output voltage, causing the integrator to progress in the opposite direction. This time-domain output signal is a pulse-wave representation of the input signal at the sampling rate ($f_S$). If the output pulse train is averaged, it equals the value of the input signal.

In the time domain, the 1-bit ADC digitizes the signal to a coarse, 1-bit output code that produces the quantization noise of the converter. The output of the modulator is equal to the input plus the quantization noise, ei–(ei–1). As this formula shows, the quantization noise is the difference between the current quantization error (ei) and the previous quantization error (ei–1).

The combination of the integrator and sampling strategy implements a noise-shaping filter on the digital output code. In the frequency domain, the time-domain output pulses appear as the input signal (or spur) and shaped noise. The noise in the modulator is moved out to higher frequencies. The quantization noise for a first-order modulator starts low at zero hertz, rises rapidly, and then levels off at a maximum value at the modulator's sampling frequency ($f_S$). Multi-order modulators shape the quantization noise to even higher frequencies than do the lower-order modulators.

Once the signal resides in the digital domain, decimation filter 100 may be used to attenuate the high-frequency noise and slow down the output data rate. Decimation filter 100 implements a low-pass filter by first sampling the modulator stream of the 1-bit code. An averaging filter is the most common filter technique used in $\Sigma\Delta$ converters. Most $\Sigma\Delta$ ADCs incorporate a class of averaging filters called sinc filters or closely related variants (higher order sinc filters, mixed-order sinc filters, etc.), named for their frequency response. The sinc filter and its variants produce filter coefficients that are all non-negative, which may be exploited for a low power implementation. The output rate of a digital filter is the same as the sampling rate. In the time domain, decimation filter 100 is responsible for the high resolution of the $\Sigma\Delta$ converter. However, in the frequency domain, decimation filter 100 applies a low-pass filter to the signal. In so doing, it attenuates the quantization noise of $\Sigma\Delta$ modulator 110; but it also reduces the frequency bandwidth. With the quantization noise reduced, the signal re-emerges in the time domain. The signal is now a high-resolution, digital version of the input signal, but it is still too fast to be useful. The second function of decimation filter 100 is to reduce the output rate of the digital output signal by throwing away portions of the output data by discarding some of the samples.

The meaningful variables in this system are the sampling rate ($f_S$) of $\Sigma\Delta$ modulator 110 and the output-data rate ($f_D$) of decimation filter 100. The ratio between these two variables is defined as the decimation ratio (DR). The decimation ratio is equal to the number of modulator samples per data output. $\Sigma\Delta$ modulator 110 samples at a frequency of $f_S$ and, in doing so, shapes the quantization noise into higher frequencies. If the data rate is chosen to be some fraction of $f_S$, the frequencies from 0 to $f_D$, which constitute the output, are in the signal band. There is a strong relationship between the output data rate and the converter's resolution. If the sample rate is kept constant, lower data rates provide high effective resolution, or ENOB, at the output of the converter.

Figure 2:
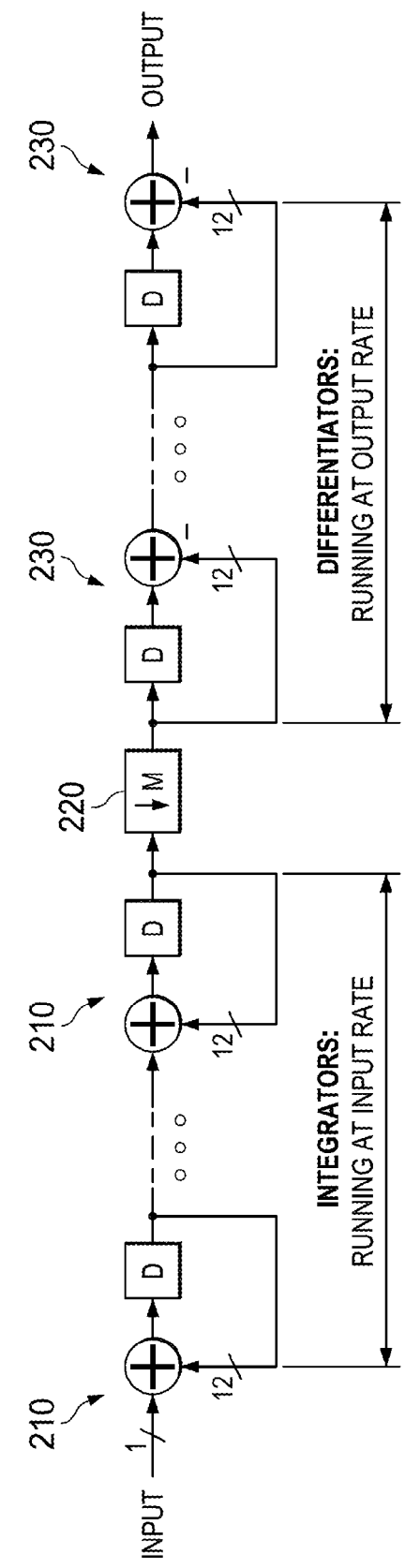
FIG. 2 is a block diagram of a cascaded integrator comb filter.
Figure 3:
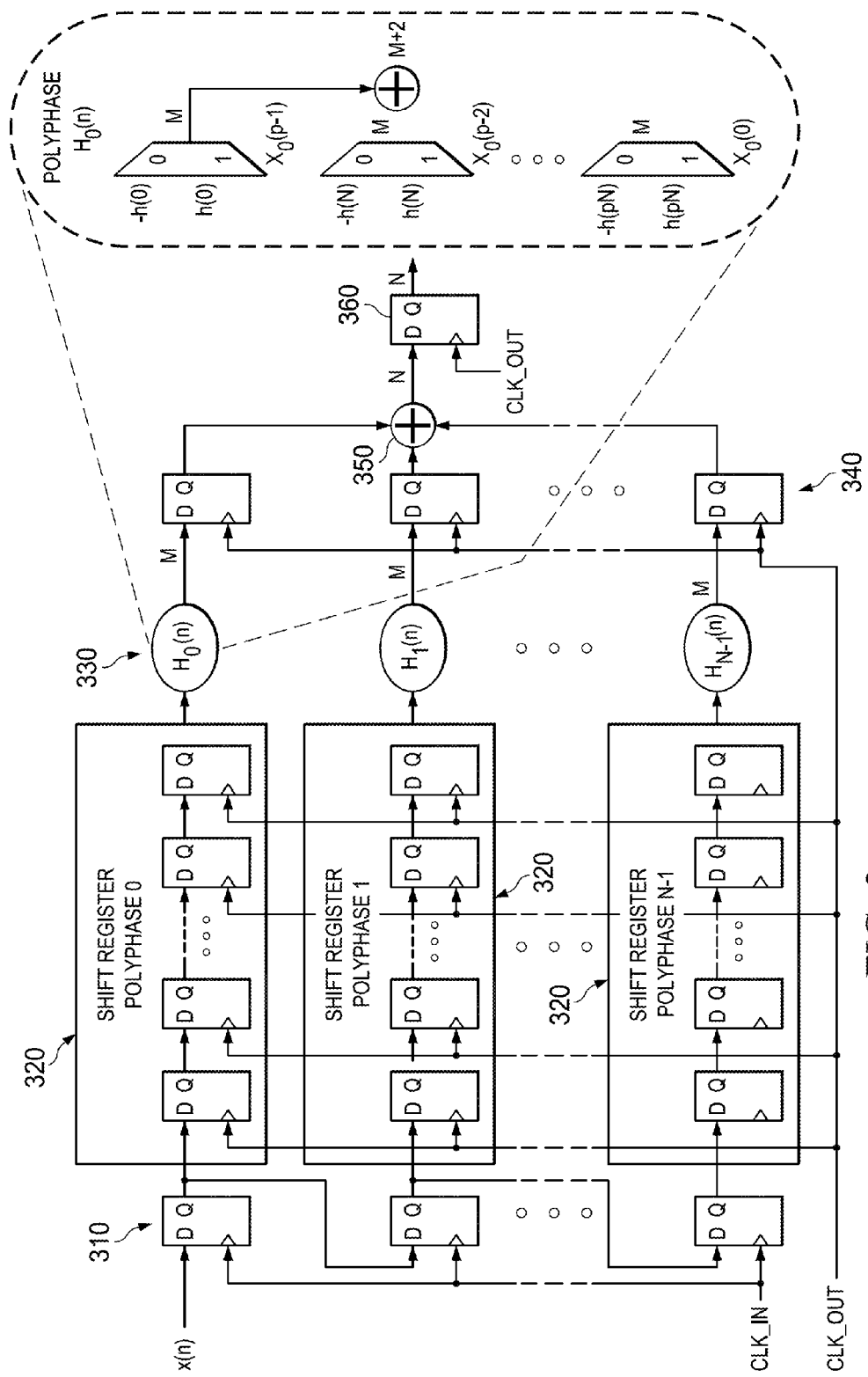
FIG. 3 is a block diagram of a polyphase filter structure.

Previous topologies for decimation filter 100 are a cascaded integrator comb filter implementation (shown in FIG. 2) and a polyphase implementation (shown in FIG. 3). A cascaded integrator-comb (CIC) filter consists of one or more integrator and differentiator filter pairs. In the case of a decimating CIC, the input signal is fed through one or more cascaded integrators 210, then down-sampler 220, followed by one or more differentiator sections 230 (equal in number to the number of integrators). The transfer function of a CIC decimator filter is $$H(z) = H_I^N(z)H_d^N(z) = \frac{(1-z^{-RM})^N}{(1-z^{-1})^N} = \left[\sum_{k=0}^{RM-1} z^{-k}\right]^N$$

where $H_I$ is the transfer function of the integrator part of the filter; $H_d$ is the transfer function of the differentiator part of the filter; N is the number of sections; R is the decimation factor; and M is the differential delay. The CIC filter uses low area, but it is high power because all the integrators run at the input rate and at full precision. For this reason it is not suited for high input frequency designs.

A polyphase decomposition implementation is fundamental to many multi-rate applications, including decimation filters. In a polyphase decomposition integrated circuit implementation, the impulse-response coefficients H(n) 330 are split into M multiple samples with D flip flops 310 and shift registers 320. This representation may be referred to as a M-component polyphase decomposition of H(z). The samples may be referred to as the polyphase components of H(z). In other words, the impulse response sequence has now been grouped into subsequences and the system can compute the fractional output samples. The polyphase circuit implementation may also include pipeline flip flops 340 at the output of each polyphase component, final adder 350, and final output flip flop 360. The polyphase circuit implementation is a tool which enables the rearrangement of computations of a filtering operation to minimize the computational load per unit time. In a polyphase filter circuit implementation, the arithmetic logic runs at the output rate. However, each polyphase output may be positive or negative depending on the data, leading to a high toggle rate. Additionally, the symmetry of the filter cannot be exploited since each polyphase filter circuit component is not necessarily symmetric. Also, each polyphase filter circuit component results in higher bit width since each component may typically be a mix of small and large coefficients.

Example embodiments of the systems and methods of low power decimation filter may exploit one or both of the single bit data input to the filter and the symmetry of the filter response. The decimation filter circuit, which follows the $\Sigma\Delta$ ADC converter, consumes significant power since it operates at very high operating frequencies. Sinc filters are integral parts of most of the high speed analog to digital converters and various wireless communication transceivers. Low power implementations of sinc filters as disclosed herein can help reduce the current consumption by more than 50% of that of the prior art. Example embodiments exploit the fact that the input to the sinc filter is a single bit of data. Example embodiments also exploit the symmetry of the filter response. In example embodiments, the input data is treated as 0 and 1 instead of –1 and +1. When the coefficients are non-negative, there are no sign bit toggles in any of the internal nodes which leads to lower power consumption. This results in constant offset at the final output which can be subtracted out later in the digital chain. The symmetry of the sinc filter is exploited since the data across different polyphases are combined. The addition of the symmetric data and coefficient multiplication may be replaced with simple muxing based on 2 data bits. The underlying data stream is low rate.

A CIC filter is very small in terms of area, but the integrator runs at the input rate. In the polyphase filter, each polyphase output is calculated separately and then each one is added together to compute the final output. All the arithmetic logic runs at the output rate. However, even though the data is only one bit, a 1 is interpreted as +1 and a 0 is interpreted as –1; so, the data is either a positive number or a negative number. In example embodiments disclosed herein, the input is mapped so that it is read as 0 and 1 instead of as −1 and +1. By a simple reinterpretation of +1 and −1 as 1 and 0, when coefficients are non-negative, sign bit toggles are avoided such that none of the outputs will be a negative number. The final output may be multiplied by 2 and a constant offset (equal to the sum of the filter coefficients) may be subtracted to determine the actual output.

The avoidance of the sign bit toggle results in lower output power consumption. The data corresponding to symmetric coefficients may be pre-added and then multiplied by the coefficient, which results in half the number of multiplications in the case of symmetric filters. In the special case of a 1-bit sinc decimation filter, the sum of two inputs results in either 00, 01, 10, or 11. This can be directly obtained from the two bits without using an adder. So instead of actually computing the output of each polyphase, the data corresponding to symmetric coefficients across multiple polyphases is combined and then multiplied by the corresponding coefficient. Since the data input to coefficient multipliers is either 0, +1, or +2, each of the coefficient multiplication results may be obtained with a simple multiplexing scheme to select either 0, h(n), or 2h(n). Zero-extension logic may be used instead of sign extension logic for all internal nodes when all coefficients are non-negative, which is the case for a sinc filter and related variants.

Figure 4:
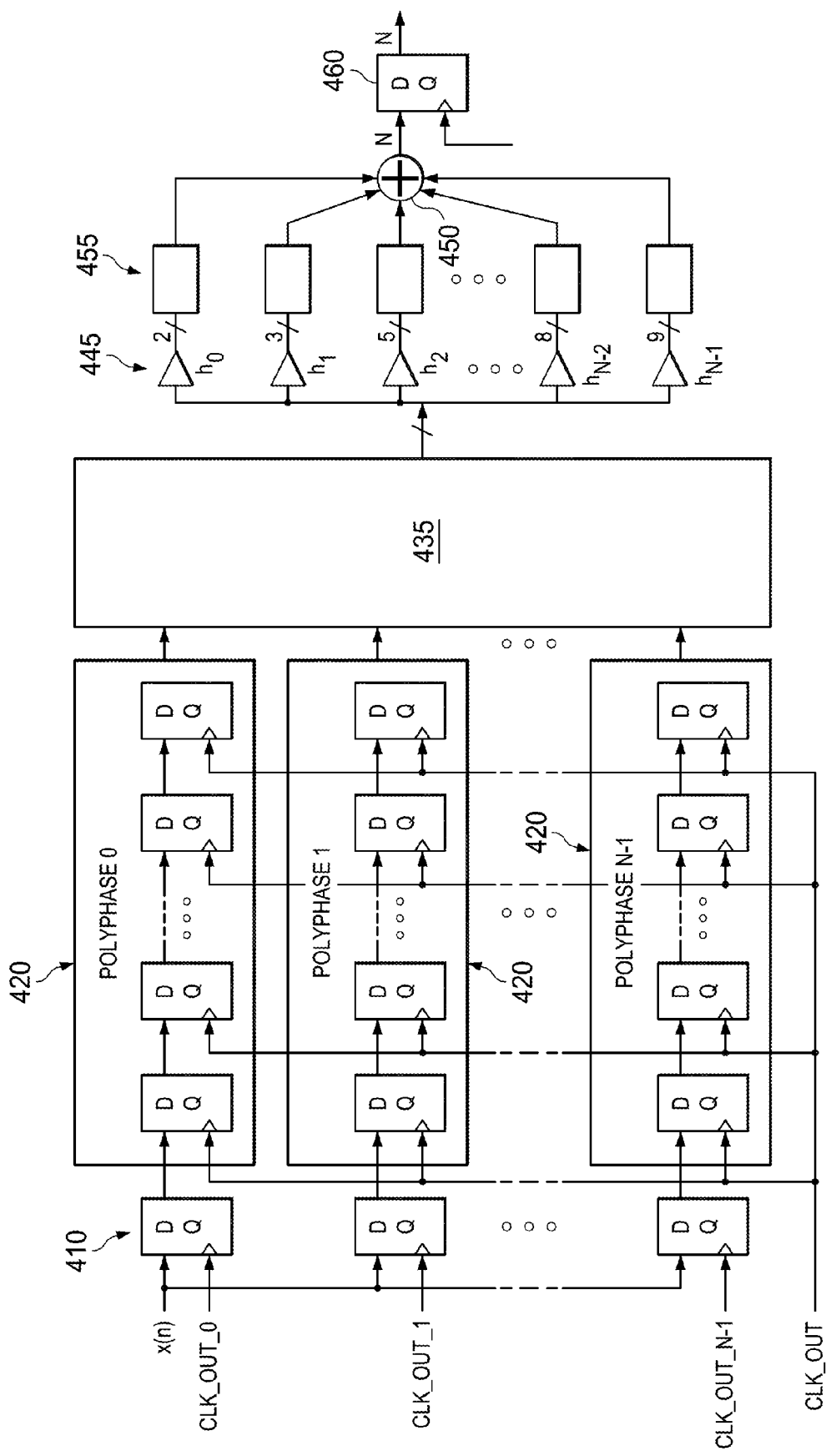
FIG. 4 is a block diagram of an example embodiment of a system of low power decimation filter.

FIG. 4 provides a block diagram of an example embodiment of a integrated circuit sigma delta analog to digital converter system for a low power decimation filter for a 1-bit $\Sigma\Delta$ ADC. Just as in the polyphase filter circuit of FIG. 3, the impulse-response coefficients H(n) are split into M multiple samples with D flip flops 410 and shift registers 420. However, in example circuit embodiments, symmetric data combiner 435 combines the data across different polyphase filters (assuming the filter coefficients are symmetric) and then the coefficients are multiplied in multiplier 445. If the filter coefficients are non-symmetric, the symmetric data combiner is not used. All combinations of symmetric/non-symmetric and non-negative/mix of positive and negative coefficients are possible as listed here. There are four basic scenarios: (1) a symmetric filter with non-negative coefficients using simple muxing to give (0, h(n), 2h(n)) for each coefficient and a zero extender for adding all the multiplier results; (2) a symmetric filter with a mix of positive and negative coefficients using simple muxing to give (0, h(n), 2h(n)) for each coefficient multiplication and a sign extender for adding all the multiplier results; (3) a non-symmetric filter with a mix of positive and negative coefficients using simple muxing to give (0, h(n)) for each coefficient multiplication and a sign extender for adding all the multiplier results; and (4) a non-symmetric filter with non-negative coefficients using simple muxing to give (0, h(n)) for each coefficient multiplication and a zero extender for adding all the multiplier results.

In extend stage 455, in the case of filters with non-negative coefficients, each of the coefficient multiplication results is zero extended to the required output bit width. If the coefficients are not non-negative, but are a mix of positive and negative, the bit growth may be performed based on the sign bit of the corresponding filter coefficient. In an example embodiment, the outputs of extend stage 455 are added in adder 450 and presented as an output by D flip flop 460.

Figure 5:
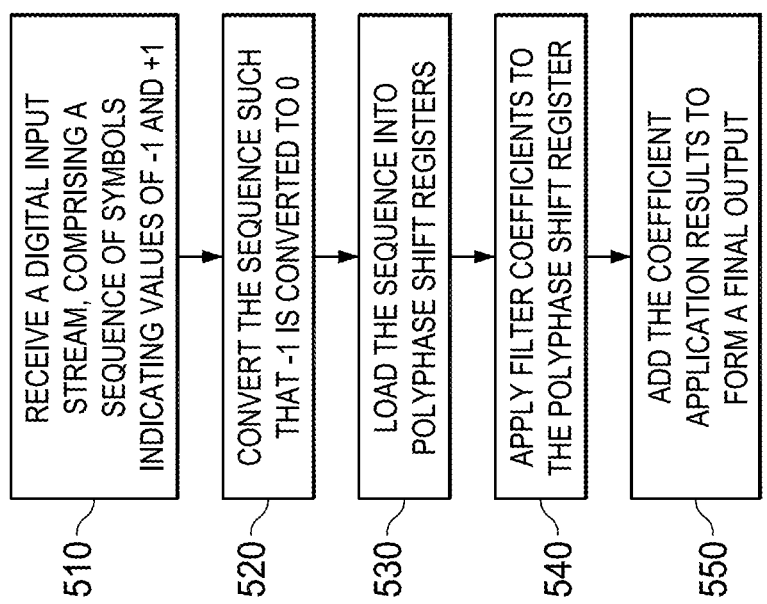
FIG. 5 is a flow diagram of an example embodiment of a method of low power decimation filter

FIG. 5 provides a flow chart of an example embodiment of a method of low power decimation filter for a 1-bit $\Sigma\Delta$ ADC. In block 510, a digital input stream is received, the digital input stream comprising a sequence of symbols indicating values of +1 and −1. In block 520, the sequence is converted such that −1 is converted to zero. In block 530, the sequence is loaded into polyphase shift registers. In block 540, the filter coefficients are applied to the polyphase shift register outputs. In block 550, the coefficient application results are added to form a final output.

The disclosed systems and methods of low power decimation filter for sigma delta ADC present the advantage of exploiting the symmetry of the filter, whereas the CIC and polyphase filters do not. In the disclosed systems and methods, bit growth is gradual, whereas, in the CIC filter, the bit growth is higher since all the adders run at the full precision specified at the output, and in the polyphase filter, the bit growth is higher since each polyphase coefficient includes low and high bit width coefficients. In the disclosed systems and methods, sign bit toggles are low since the inputs are treated as 0 and +1 instead of −1 and +1. Comparatively, the CIC filter has a very high number of sign bit toggles since the input is treated as −1 and +1; and the polyphase filter also has a high number of sign bit toggles since each coefficient multiplication results in +h or −h since the data is treated as −1 and +1.

The area of the CIC filter is very low since the number of adders and flip flops is low. The area of the disclosed systems and methods is also low since zero extension is possible for each coefficient multiplication result. However, the area of the polyphase filter is higher since most of the adders are of higher bit width due to sign extensions in each coefficient. The power consumption of the CIC filter is very high because the adders in the integrator are running at the output. The power consumption of the polyphase filter is also high since the adders even at the early stages involve higher bit width, involves sign bit toggles, and a higher number of arithmetic operations due to unused coefficient symmetry. Comparatively, the disclosed systems and methods of low power decimation filter for sigma delta ADC consume much lower power since the symmetry is exploited and the bit growth is gradual.

In an example implementation of a $4^{th}$ order sinc decimation filter over frequency ranges of (1) from 1.8 GHz to 450 MHz, (2) from 600 MHz to 66.67 Mhz, and (3) from 6 MHz to 666.7 kHz, the power was reduced in frequency range (1) from 1179 uW using a polyphase implementation (using an area of 2669 $um^2$) to 512 uW using the disclosed systems and methods of low power decimation filter for sigma delta ADC (using an area of 1891 $um^2$). In frequency range (2), the power was reduced from 2000 uW using a CIC filter (using an area of 2036 $um^2$) and 391 uW using a polyphase implementation (using an area of 2658 $um^2$) to 167 uW using the disclosed systems and methods of low power decimation filter for sigma delta ADC (using an area of 1867 $um^2$). In frequency range (3), the power was reduced from 8 uW using a CIC filter (using an area of 1273 $um^2$) and 4 uW using a polyphase implementation (using an area of 2659 $um^2$) to 1.63 uW using the disclosed systems and methods of low power decimation filter for sigma delta ADC (using an area of 1867 $um^2$).

Although the present disclosure has been described in detail, it should be understood that various changes, substitutions and alterations can be made thereto without departing from the spirit and scope of the disclosure as defined by the appended claims.

Therefore, at least the following is claimed:
1. A method comprising:
   receiving a digital input stream, the digital input stream comprising a sequence of symbols indicating values of −1 and +1;
   converting the sequence such that −1 is converted to zero;

loading the converted sequence into a plurality of polyphase shift registers;

applying filter coefficients to the polyphase shift register outputs; and adding the coefficient application results to form a final output.

2. The method of claim 1, wherein, if the filter coefficients are symmetric, adding data corresponding to the symmetric filter coefficients across different polyphase components and applying the corresponding filter coefficients.

3. The method of claim 2, wherein adding data corresponding to the symmetric filter coefficients comprises concatenating two inputs to achieve the final output.

4. The method of claim 2, wherein applying filter coefficients comprises multiplexing based on two bits of a symmetric data combiner and the filter coefficients to select from 0, h(n), and 2h(n).

5. The method of claim 2, wherein adding the coefficient application results comprises bit growth with zero extension for filters with non-negative coefficients.

6. The method of claim 2, wherein adding the coefficient multiplication result comprises bit growth with sign extension based on a sign bit of the filter coefficient for filters with a mix of positive and negative coefficients.

7. The method of claim 1, wherein, if the filter coefficients are non-symmetric and non-negative, applying the filter coefficients comprises multiplexing to select from 0 and h(n).

8. The method of claim 7, wherein adding the coefficient application results comprises bit growth with zero extension for filters with non-negative coefficients.

9. The method of claim 7, wherein adding the coefficient application results comprises bit growth with sign extension based on the sign bit of the filter coefficient for filters with a mix of positive and negative coefficients.

10. An integrated circuit sigma delta analog to digital converter, comprising:

a plurality of D flip flops, each of the plurality of D flip flops configured to receive one bit of an N-bit sequence;

a plurality of shift registers configured to load the input sequence;

a multiplexer configured to apply filter coefficients to the output of the plurality of shift registers;

a plurality of extenders configured to extend the output of a coefficient multiplexer; and a summer to sum the outputs of the plurality of extenders.

11. The integrated circuit sigma delta analog to digital converter of claim 10, wherein the plurality of D flip flops and the plurality of shift registers are configured to form a polyphase filter structure.

12. The integrated circuit sigma delta analog to digital converter of claim 10, wherein, if the filter coefficients are symmetric, further comprising a symmetric data combiner configured to combine the outputs of the plurality of shift registers which correspond to symmetric coefficients.

13. The integrated circuit sigma delta analog to digital converter of claim 12, wherein the multiplexer is configured to apply the filter coefficients based on two bits of the symmetric data combiner and the filter coefficients to select from 0, h(n), and 2h(n) without using a multiplier.

14. The integrated circuit sigma delta analog to digital converter of claim 10, wherein if the filter coefficients are non-symmetric, the multiplexer is configured to apply the filter coefficients based on each data bit of the polyphase shift register and the filter coefficients to select from 0 and h(n).

15. The integrated circuit sigma delta analog to digital converter of claim 10, wherein if the filter coefficients are a mix of positive and negative coefficients, the plurality of extenders are configured to perform sign extension based on a corresponding filter coefficient.

16. The integrated circuit sigma delta analog to digital converter of claim 10, wherein, if the filter coefficients are non-negative, the plurality of extenders are configured to perform zero extension of the results of coefficient multiplication.

17. The integrated circuit sigma delta analog to digital converter of claim 10, wherein the summer uses unsigned logic.

18. An integrated circuit sigma delta analog to digital converter, comprising:

a plurality of polyphase filter components configured to receive a stream of unsigned data bits;

a combiner configured to combine the outputs of the polyphase filter components if coefficients of the filter components are symmetrical;

a multiplier configured to apply the filter coefficients to the output of the multiplexer if the filter coefficients are symmetrical or to the outputs of the plurality of polyphase filter components if the filter coefficients are non-symmetrical; and a sign extender configured to sign extend the outputs of the multiplexer if the filter coefficients are a mix of positive and negative coefficients; or a zero extender configured to zero extend the outputs if the filter coefficients are non-negative.

19. The integrated circuit sigma delta analog to digital converter of claim 18, wherein the multiplexer is configured to apply the filter coefficients based on two bits of the symmetric data combiner and the filter coefficients to select from 0, h(n), and 2h(n) without using a multiplier.

20. The integrated circuit sigma delta analog to digital converter of claim 18, wherein if the filter coefficients are non-symmetric, the multiplexer is configured to select from 0 and h(n).

* * * * *